United States Patent [19]

Eberhard

[11] 3,952,211

[45] Apr. 20, 1976

[54] SYSTEM FOR CONTROLLING THE THRESHOLD SETTING OF A FIELD EFFECT MEMORY DEVICE

[75] Inventor: Everett Eberhard, Tempe, Ariz.

[73] Assignee: Motorola, Inc., Chicago, Ill.

[22] Filed: May 3, 1974

[21] Appl. No.: 466,749

Related U.S. Application Data

[63] Continuation of Ser. No. 270,075, July 10, 1972, abandoned.

[52] U.S. Cl. ............................... 307/238; 307/228; 328/57; 307/251; 307/255; 307/262; 307/264; 307/279
[51] Int. Cl.² ........................................ H03K 5/00
[58] Field of Search ............... 357/23, 54; 307/251, 307/238, 279, 255, 264, 262, 228; 328/57

[56] References Cited
UNITED STATES PATENTS

| | | | |
|---|---|---|---|
| 3,591,852 | 7/1971 | Chen | 357/23 |
| 3,624,415 | 11/1971 | Atkins et al. | 307/264 |
| 3,657,575 | 4/1972 | Taniguchi et al. | 307/264 |
| 3,713,111 | 1/1973 | Ross | 307/238 |
| 3,714,470 | 1/1973 | Goldberg | 307/228 |
| 3,723,762 | 3/1973 | Nakaya | 307/228 |

Primary Examiner—Andrew J. James
Assistant Examiner—Joseph E. Clawson, Jr.
Attorney, Agent, or Firm—Michael D. Bingham; Sang Ki Lee; Harry M. Weiss

[57] ABSTRACT

Apparatus and system for controlling the gate threshold settings of MNOS memory devices is disclosed. Positive or negative pulses depending on turn-on or turn-off of relatively large amplitude and relatively low frequency are applied to the gate of the MNOS device whose threshold is to be set and to whose gate a bias value equal to the desired setting has been applied. A feed back circuit, in response to the change in current conduction condition of the test MNOS device caused by the application of the pulses, reduces the magnitude of the pulses to a low value as the gate threshold value reaches the desired set value.

4 Claims, 6 Drawing Figures

SYSTEM FOR CONTROLLING THE THRESHOLD SETTING OF A FIELD EFFECT MEMORY DEVICE

This is a continuation, of application Ser. No. 270,075, filed July 10, 1972, now abandoned.

BACKGROUND OF THE INVENTION

This invention relates to apparatus and/or systems for controlling the threshold setting of field effect memory devices such as MNOS transistors and it is an object of the invention to provide improved apparatus and systems of this nature.

Field effect semiconductor devices known as MNOS transistors are very desirable for use as memory devices because when once the gate threshold voltage thereof has been set it retains that setting for a long time thereafter even though the setting voltage and all bias voltages are removed. Moreover, the threshold value of MNOS transistors can be changed from a strong enhancement mode where the threshold is at −5 to −10 volts to a strong depletion mode where the threshold is +5 to +10 volts, for example. This property of MNOS devices increases their potential of use very substantially because the setting can be changed to meet requirements of any given situation.

Ordinarily, setting the threshold of MNOS transistors is accomplished by applying relatively large positive or negative voltage pulses to the gate electrode. The principal problem is that of obtaining the desired threshold voltage without a lot of cut and try. The application of large pulses of a fixed amplitude will move the threshold from one value to another but it is necessary to stop the process when the desired condition of "on" or "off" is reached. In the past, this has been a hit or miss, or trial and error, process in which several pulses are applied to the threshold of the device following which a measurement is made to determine the threshold value. And, if not correct, additional pulses are applied and further measurements made. The process is continued until a desired value is reached. This, of course, is time consuming and tedious and it is therefore an object of the invention to provide an improved system for setting the threshold value of a field effect MNOS device which overcomes the deficiencies of the prior art.

It is a further object of the invention to provide an improved system and apparatus for controlling the threshold setting of a field effect MNOS device which automatically terminates the setting process when the desired threshold value has been reached. This makes it possible to easily obtain the same threshold setting even when NMOS devices with different characteristics are being used.

It is a further object of the invention to provide improved apparatus and systems of the nature indicated which are simple in form, easy to use, and accurate in operation.

It is a further object of the invention to provide an improved apparatus and system of the nature indicated which utilizes a feedback circuit to control the termination of setting threshold of an MNOS to the value desired.

SUMMARY OF THE INVENTION

In carrying out the invention according to one form there is provided apparatus for setting the gate threshold voltage of a memory device having an input, an output and a gate to a predetermined voltage value from some other voltage value comprising means for applying a bias voltage value of such predetermined value to the gate of such a memory device, means for applying a voltage to the input and output of such a memory device, means for generating voltage pulses having an initial amplitude greater than the amplitude of said predetermined value, means for applying said voltage pulses to said gate, and means responsive to the change in current conduction of the source-drain of such memory device produced by said application of said voltage pulses to said gate for causing said generating means to reduce the amplitude of said pulses, essentially, at the time that the threshold voltage of said memory device is essentially equal to the value of said bias voltage.

According to other forms of the invention, the memory device is an MNOS transistor; a corrective voltage is generated and applied to the gate of the MNOS transistor; the corrective voltage generates a single pulse and responsive means determine the duration of the pulse; the corrective voltage generates a series of pulses and the responsive means reduces the amplitude of the pulses; and the responsive means determine the number of pulses.

BRIEF DESCRIPTION OF THE DRAWINGS

FIG. 6 is a fragmentary drawing of an MNOS transistor.

DESCRIPTION OF THE PREFERRED EMBODIMENT

Figure 1:
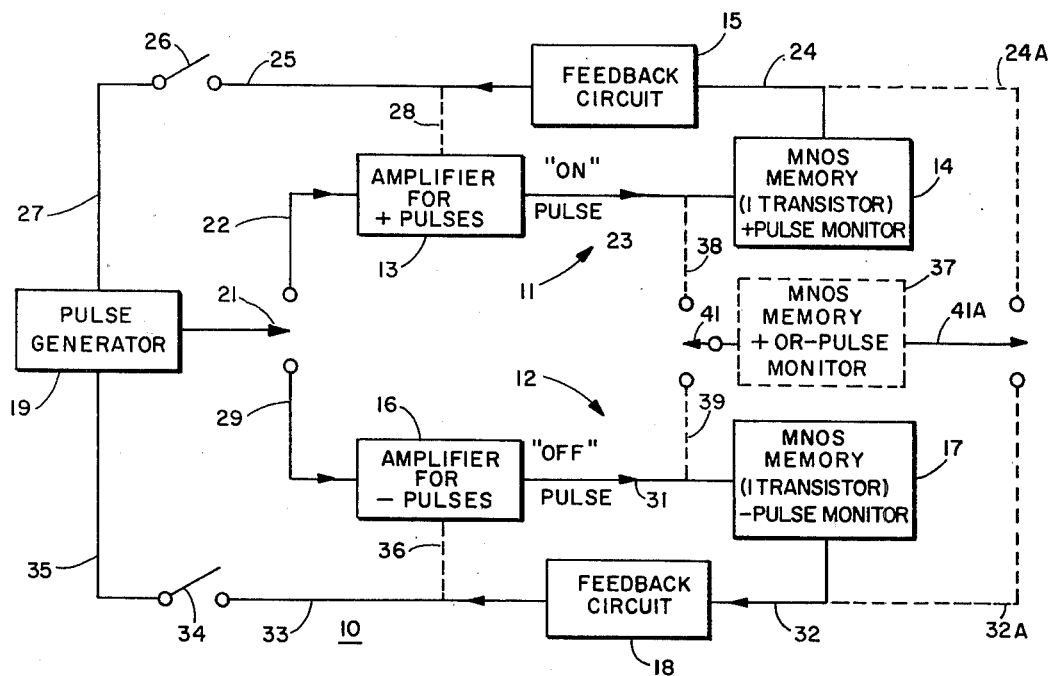
FIG. 1 is a block diagram of a system embodying the invention.

Referring to the drawings, there is shown in FIG. 1 a circuit diagram 10 in block form whereby the MNOS memory transistor can be set to an on state or to an off state at any threshold value as desired. Thus the circuit 10 comprises two branches 11 and 12. Circuit branch 11 applies turn-on pulses to an MNOS transistor and comprises a positive pulse amplifier 13, an MNOS memory transistor 14, and a feedback circuit 15. Similarly, circuit 12 includes a negative pulse amplifier 16, an MNOS memory transistor 17, and a feedback circuit 18. Each of the circuits 11 and 12 include the pulse generator 19 as part thereof. The pulses from generator 19 are supplied through a switch 21 to amplifier 13 for plus pulses by way of conductor 22, and from the amplifier 13 over conductor 23 to the MNOS memory transistor 14.

An indication of the threshold setting achieved in MNOS memory transistor 14 is transmitted by way of conductor 24 to the feedback circuit 15 and thus by way of conductor 25, switch 26, and conductor 28 to the pulse generator 19. If the feedback circuit 15 feeds its signal to the pulse generator 19, as shown, by way of conductor 25, switch 26, and conductor 27, the feedback signal may be used to control pulse amplitude, pulse width or possibly pulse repetition rate. If the control voltage is fed back to the pulse amplifier 13 by way of conductor 28, shown dotted, the control voltage is used to control the pulse amplitude only.

If an MNOS transistor is on and it is desired to turn it off, off pulses are supplied through a circuit 12. For this case, the switch 21 of pulse generator 19 is connected by way of conductor 29 to a negative pulse amplifier 16 and thence by way of conductor 31 to MNOS memory transistor 17 and by way of conductor 32 to feedback circuit 18 and therefrom by way of conductor 33, switch 34, and conductor 35 to the pulse generator. The feedback circuit 18 for this case will function in the same manner as described for the feedback circuit 15. For this purpose a conductor 36, shown dotted, is provided in order that the control voltage from feedback circuit 18 may be transmitted to amplifier 16.

If desired, a single MNOS memory transistor circuit 37, shown dotted, may be provided in place of the two circuits 14 and 17. In this instance the outputs of amplifiers 13 and 16 are transmitted by way of conductors 38 and 39, shown dotted, and switch 41 to the MNOS memory 37 which may be for either positive or negative pulses. From memory 37, the circuits are completed by means of switch 41A and either conductors 24A or 32A shown dotted.

An MNOS device to which the circuitry of the application has reference is shown diagrammatically in FIG. 6. This showing is by way of example only inasmuch as many forms of MNOS devices, or other appropriate memory devices, may be devised. As shown in FIG. 6 the MNOS device 42 comprises an N-type substrate 43 into which there has been formed, as by diffusion, two P-type regions 44 and 45 which may be designated as the source and drain regions. The distance between the regions 44 and 45 is the length of the channel, and contacts 46 and 47, respectively are formed on the regions 44 and 45. A thin layer 48 of an insulating material such as silicon dioxide is formed to overly the channel region and a portion of each of the source and drain regions 44 and 45. Overlying the silicon dioxide layer 48 is a silicon nitride layer 49. Over the silicon nitride layer 49 there is a gate contact 51 to which a terminal is attached. An MNOS device of the nature very briefly described here is of the depletion type and would be in an off state in the absence of an appropriate charge placed upon the gate structure. As already pointed out above, MNOS devices of the nature involved here may be turned on from an off state or may be turned off from an on state and once having been turned on or off the device will remain in that state until an appropriate voltage is applied to change it as will be more fully described.

While the invention has application to the turning on or off, and at particular gate voltage values, of single MNOS devices it has equal application to changing the settings of a large number of devices at the same time. For example on any particular integrated circuit semiconductor chip there may be many MNOS transistors all of which have their gates connected together and utilize a common substrate on which the conductive channels may be formed. Then by taking such a chip and connecting one of the MNOS transistors thereon to the circuit, as will be described, all of the MNOS transistors on that chip may have their settings changed at the same time. The particular MNOS transistor which is connected to the setting circuit is thus a monitoring device for all of the transistors. It is a safe assumption that the processing in which the chip is formed is sufficiently uniform that all MNOS transistors on the chip have essentially the same characteristics and do not vary from each other in any significant way. Thus when one of these transistors becomes set all of the transistors will be set to the same extent.

One of the purposes of the invention is to provide a circuit whereby a feedback system will positively control the threshold voltage to which the MNOS device is set. This will enable devices with different characteristics to be used interchangeably because the setting is so easily changed, and should improve the yield of useable MNOS devices. That is to say, whenever it is desired to change the setting of a particular MNOS device it can be done at the will of the operator.

Figure 2:
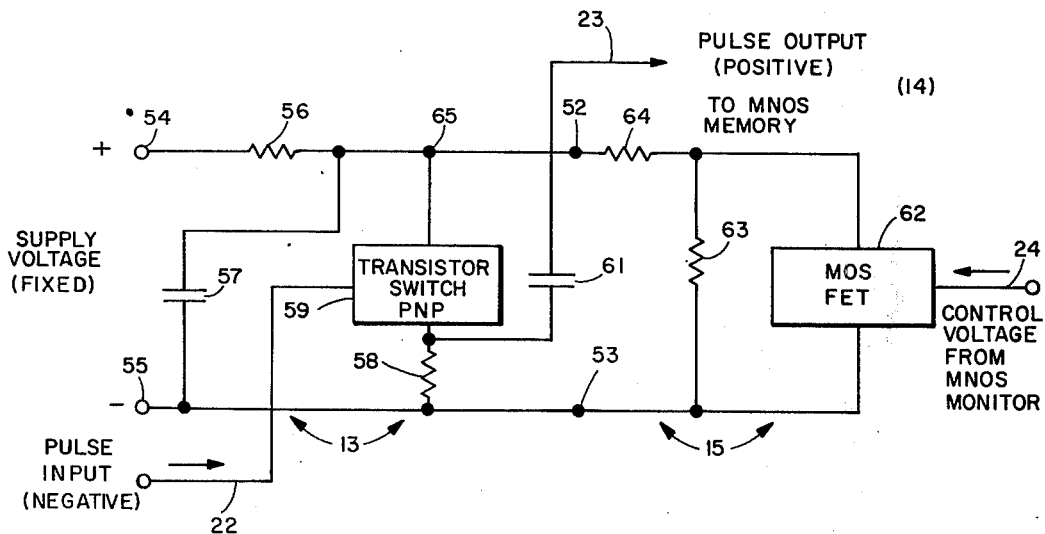
FIG. 2 is a simplified circuit diagram illustrating the principle of operation of the invention.

In FIG. 2 there is shown a more complete circuit diagram, but one still of simplified form for changing the setting of an MNOS memory device (14) from an off, or nonconducting state, to an on, or conducting, state for a particular value of threshold or gate voltage. In FIG. 2 components which conform to those of FIG. 1 will carry the same reference characters. Thus in FIG. 2 the conductor 23 carries the output pulses from amplifier 13 to an MNOS memory or monitor device 14 and a signal indicative of the condition of the MNOS device, after setting, is carried over conductor 24 to a feedback circuit 15.

In FIG. 2 between the amplifier portion 13 and the feedback circuit 15 there are shown terminals 52 and 53 for convenience in designating the portions of the circuit. Thus the amplifier portion 13 is supplied with pulses over conductor 22 from a pulse generator, not shown, and the amplifier comprises a fixed supply voltage at terminals 54 and 55, a resistor 56, a capacitor 57, a resistor 58 and a transistor switch 59 of the PNP variety connected as shown, a capacitor 61 being connected in the conductor 23 of the output pulses. The feedback circuit 15 comprises an MOS field effect transistor 62 to which the control voltage from the MNOS monitor 14 is supplied over conductor 24 and a parallel resistor 63, the parallel combination of MNOS transistor 62 and resistor 63 being in series with a further resistor 64. The fixed supply voltage at terminals 54 and 55 appears at terminals 52 and 53 diminished by the IR drop through resistor 56.

As the control voltage on conductor 24 changes, the resistance of the MNOS field effect transistor 62 changes either to increase or decrease its resistance. In this way the resistance of the parallel combination of transistor 62 and resistor 63 changes and thus changes the resistance of the series parallel combination including resistor 64. If the resistance of this combination goes down the current supplied from terminals 54 and 55 tends to increase thereby causing a greater IR drop through resistor 56 and thus decreasing the voltage at the terminal 65. Decreasing this voltage causes a decrease in the amplitude of the pulses appearing on conductor 23, as will be described. Similarly, decreasing the current flow through resistor 56 increases the voltage at terminal 65 and thus increases the amplitude of the output pulses on conductor 23, although this phenomenon is not used. With the amplifier circuit as shown, negative pulse inputs on conductor 22 result in positive output pulses on conductor 23. This may be reversed as will become evident in considering FIG. 3.

Figure 3:
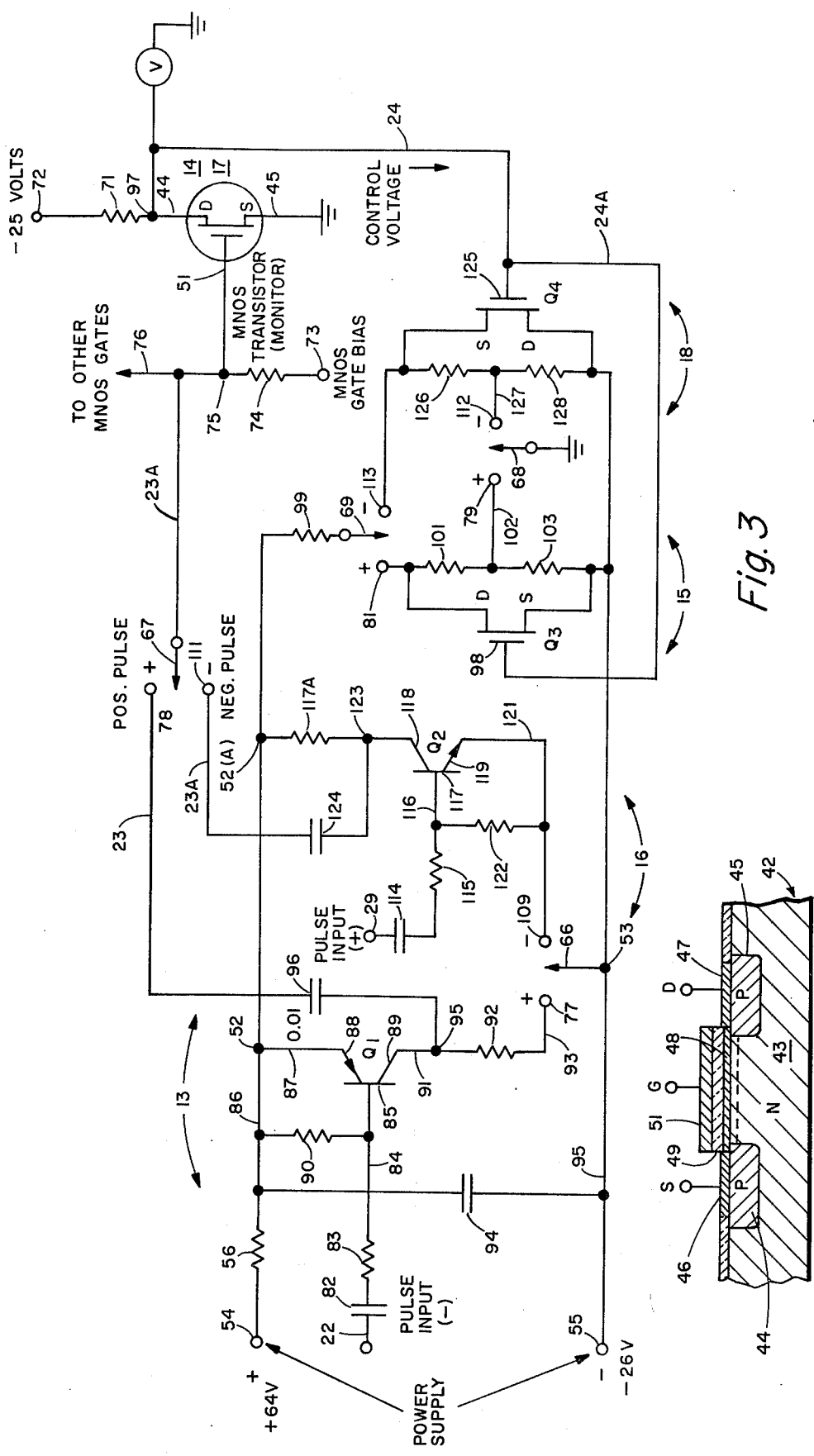
FIG. 3 is a circuit diagram of a system according to the invention.

Referring to FIG. 3 a complete circuit according to the invention is shown wherein an MNOS device may have its setting changed from either on or off to the opposite of these and to any value of gate threshold voltage desired. In considering this circuit the same reference characters are used as are used in connection with FIGS. 1 and 2. Thus an MNOS device 14, or 17, is shown supplying a control voltage over conductor 24 to the feedback circuits 15 and 18 and the amplifiers 13 and 16 are supplied with power over terminals 54 and 55, input pulses being supplied over conductors 22 and 29, and output pulses being supplied over conductors 23 and 23A. The circuit of FIG. 3 is arranged to produce either positive or negative output pulses as desired, and supply them to the gate terminal 51 of the MNOS devices 14 or 17 depending upon the position of the switches 66, 67, 68 and 69. The MNOS device 14 or 17 is connected in the control loop and as shown it is loaded with a resistor 71 having a value of about 220 K ohms. The sources of the device 14 and 17 are shown connected to ground and the drains are connected through the resistor 71 to a source of voltage 72 which for example, may be −25 volts. The resistor 71 could, for example, also be an MOS load device.

The operation of the circuit shown in FIG. 3 and the additional structure thereon may be described by considering two examples of operation, one for a turn on setting and one for turn off setting.

Considering first the turn on operation, it is assumed that the MNOS device 14 is in an off condition and that positive pulses will first be applied to gate terminal 51 to turn it on. It is also assumed that the device 14 is to be turned on and have a threshold value of +4 volts. Thus there are 4 volts plus applied to terminal 73 as a gate bias, the terminal 73 being connected through a resistor 74 to 10 Meg ohms of a terminal 75 which is connected to the gate 51. The terminal 75 is also connected by means of a conductor 76 to other MNOS gates which are to be turned on at the same time and to the same gate voltage. For this condition the switch 66 is connected to terminal 77, the switch 67 is connected to terminal 78, the switch 68 is connected to terminal 79 and the switch 69 is connected to terminal 81.

The voltage between terminals 54 and 55, for example, would be about 90 volts in the example being considered, the terminal 54 being at about 64 v. and the terminal 55 at −26v. Due to the voltage divider action of resistors 56, 99, 101 and 103 the voltage between terminals 52 and 53 will be less than 90 volts, in this case approximately 60 volts. Negative pulses are supplied from any suitable oscillator at a relatively low frequency of say 10 to 20 cycles per second and are supplied over conductor 22 through capacitor 82 of 0.01 mfds, resistor 83 of about 33 K ohms and conductor 84 to the base 85 of the PNP transistor $Q_1$. The emitter-collector circuit of transistor $Q_1$ extends from conductor 86, terminal 52, through conductor 87, emitter 88, collector 89, conductor 91, resistor 92 of 10 K ohms, conductor 93, terminal 77, and switch 66 to the terminal 53. The resistor 90 of 470 K ohms is connected across the base-emitter of transistor $Q_1$ for bias purposes as is well understood.

Under the influence of the pulses coming in via conductor 22, transistor $Q_1$ is turned on, that is, driven into heavy conduction thereby producing an output voltage at terminal 95 with a peak value equal to the DC voltage from terminal 52 to terminal 53 minus the saturation voltage between the collector and emitter of $Q_1$. The saturation voltage is only a few tenths of a volt and can normally be neglected. Thus the pulse voltage produced is approximately 60 volts. The pulse input to $Q_1$ on conductor 84 is about 23 volts and the base current is consequently limited to about 0.7 ma by the resistor 83. The capacitor 94 connected across conductors 86 and 95 having a value of about 0.33 mfd is charged and discharges through the transistor $Q_1$ to maintain the pulse value indicated. When the transistor $Q_1$ conducts the voltage of terminal 95 becomes a positive pulse which passes through capacitor 96 of about 0.01 mfd and thus over conductor 23 switch 67 and conductor 23A to the gate (or gate terminal) 51. Through the circuit described the gate 51 receives a series of positive pulses of the order of 60 volts peak. Under the influence of these pulses the MNOS device 14 may begin to conduct after several of the pulses have been applied.

Prior to application of pulses to the gate 51 the MNOS device 14 is nonconducting (so assumed, for example) and thus the voltage at terminal 97 (conductor 24) is at −25 volts. The gate 98 of MOS transistor $Q_3$ is thus biased to −25 volts by virtue of the conductors 24 and 24A. Transistor $Q_3$, being an MOS transistor, N channel (induced), enhancement mode, is thus nonconducting and the voltage on conductor 86 is that determined by the IR drop through resistor 56 of about 22 K ohms depending upon the current flowing through the resistor 99 of 10 K ohms, switch 69 to terminal 81, resistor 101 of 4.7 K ohms, conductor 102, terminal 79, and switch 68 to ground. The resistor 101 is in series with a resistor 103 of 15 K ohms across the source-drain of MNOS transistor $Q_3$. Under the conditions described the terminal 81 will be at a value of about +8.1 volts. As the MNOS device 14 begins to conduct under the influence of pulses applied to gate 51, the voltage at terminal 97 decreases toward zero and this voltage is transmitted over conductors 24 and 24A to the gate 98 of transistor $Q_3$. As the voltage on gate 98 of $Q_3$ decreases toward zero, the threshold of MOS transistor $Q_3$ is passed and increasing current flows through the source-drain of this transistor, thereby decreasing the voltage across resistors 101 and 103. Increased current then flows through the parallel combination of transistor $Q_3$ and resistors 101 and 103, and thus through the series combination with resistor 99 and resistor 56. By virtue of the I.R. drop across resistor 56 the voltage at terminal 52 decreases and thus the magnitude of the pulses applied to the gate 51 of the MNOS device also decreases, the pulses being transmitted through the circuit described. As the MNOS device 14 continues to conduct more current under the influence of the applied pulses, the control voltage over conductors 24 and 24A decreases toward zero still further causing MOS transistor $Q_3$ to conduct more. The voltage at terminal 52 decreases proportionally with consequent decrease of the amplitude of the positive pulses applied to the gate 51 of the MNOS device 14.

Figure 4:
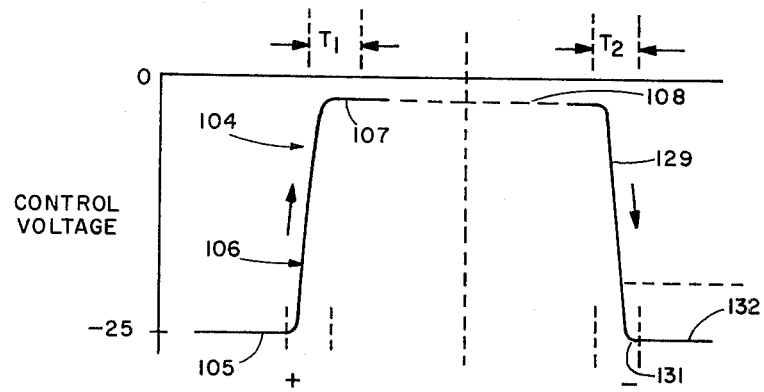
FIG. 4 is a graph useful in explaining the operation of the invention.

When the current through MNOS device 14 has increased to the point where the voltage at terminal 97 and thus the voltage at the gate of transistor $Q_3$ and ultimately the amplitude of pulses applied at gate 51 are such that no further increases in current through MNOS device 14 can occur, the process comes to a halt. This may be visualized by referring to the graph 104 of FIG. 4 which is a plot of the control voltage existing on conductors 24 and 24A (voltage at terminal 97) with time. Thus initially the control voltage is at −25 volts and no conduction through MNOS device 14 is taking place. This is represented by the portion 105 of the graph. As device 14 conducts, the control voltage decreases toward 0 as shown by the graph portion 106 and it decreases rapidly at the vicinity of $T_1$ portion 107 of graph. In the area of $T_1$, the control voltage has decreased toward 0 as close as it can, differing only by its own I.R. drop. The MNOS device 14 is conducting at its greatest rate, in effect being turned on full to where the resistance across its source-drain is a relatively low value. The time interval $T_1$ at the knee or bend of the curve 104 takes place fairly rapidly and over a relatively few pulses. The magnitude of the pulses on gate 51 has dropped to a low value and the threshold setting on the gate 51 is that value applied to it as a bias at terminal 73. The portion 107 of the graph is reached on each setting irrespective of the threshold value setting.

The feedback circuit thus, in effect, also determines the number of pulses which occur before discontinuing the application of pulses to gate 51.

Consider now the reverse situation. That is when the MNOS device 14 is replaced by the MNOS device 17 which is in an on condition with a certain threshold value and it is desired to set it to an off position with a different threshold value. For the description of this operation the reference characters as used for the turn off condition in FIG. 1 are the same as those used in FIG. 3. Thus the MNOS device, for example, is 17 for this concurrence to exist. Referring briefly, again, to FIG. 4 it will be noted that since the MNOS device 17 is in a conducting condition, the control voltage is at a low negative value as shown by the portion 108 of the graph. That is to say the MNOS device 17 is conducting current fully which is flowing through the resistor 71 and in so doing the voltage at terminal 97 is diminished by the IR drop through the resistor. Thus the voltage at terminal 97 (curve portion 108) is at a low negative value.

For the turn off aspect of the operation negative pulses are supplied to the gate terminal 51 of MNOS device 17 and for this purpose the switch 66 is connected to the terminal 109 of amplifier 16, the switch 67 is connected to terminal 111, the switch 68 is connected to terminal 112, and the switch 69 is connected to terminal 113. In addition, a negative bias voltage of the magnitude desired for example −4 volts is connected to the terminal 73 and is applied through resistor 74 and terminal 75 to the gate terminal 51 of the MNOS device 17. Also as described in connection with turn on, the conductor 76 may be connected to the gates of other MNOS devices in order that all the MNOS devices on one I/C chip may be set at the same time utilizing only one MNOS device as a monitor.

The operation of the circuit of FIG. 3 and the additional structure thereon for turn off operation is as follows, it being evident that the applied voltages to the circuit are the same as for turn on operation.

Positive pulses are supplied from any suitable oscillator at a relatively low frequency of say 10 to 20 cycles per second and are supplied over conductor 29 through capacitor 114 of 0.01 mfds, resistor 115 of about 33 K ohms and conductor 116 to the base 117 of NPN transistor $Q_2$. The emitter-collector circuit of transistor $Q_2$ extends from conductor 86, terminal 52A, resistor 117A of about 10 K ohms through collector 118, emitter 119, and conductor 121, terminal 109, and switch 66 to the terminal 53. The resistor 126 of 470 K ohms is connected across the base-emitter of transistor $Q_2$ for bias purposes as is well understood.

Under the influence of the pulses coming in via conductor 29 transistor $Q_2$ is turned on, that is, driven into heavy conduction thereby producing an output voltage at terminal 123 with a peak value equal to the DC voltage at terminal 52 minus the saturation voltage between the collector and emitter of $Q_2$. The saturation voltage is only a few tenths of a volt and can normally be neglected. The pulse input to $Q_2$ on conductor 116 is about 23 volts and the base current is consequently limited to about 0.7 ma by the resistor 115. The capacitor 94 connected across conductors 86 and 95 is charged and discharges through the transistor $Q_2$ to maintain the pulse value indicated. When the transistor $Q_2$ conducts the voltage of terminal 123 becomes a negative pulse which pass through capacitor 124 of about 0.01 mfd and thus over conductor 23A, terminal 111, switch 67 and conductor 23A to the gate (or gate terminal) 51. Through the circuit described the gate 51 receives a series of negative pulses of the order of 60 volts below ground. Under the influence of these pulses the current through MNOS device 17 may begin to decrease after several of the pulses have been applied.

Prior to the application of pulses to the gate 51 the MNOS device 17 is conducting (so assumed, for example) and thus the voltage at terminal 97 (conductor 24) is at just below 0 volts. The gate 125 of MOS transistor $Q_4$ is thus biased to about 0 volts by virtue of conductor 24. Transistor $Q_4$, being an MOS transistor, P channel (induced), enhancement mode, is thus non-conducting and the voltage on conductor 86 is that determined by the IR drop through resistor 56 depending upon the current flowing through the resistor 99 switch 69 to terminal 113, resistor 126 of 1.8 K ohms, conductor 127, terminal 112, and switch 68 to ground. The resistor 126 is in series with a resistor 128 of 18 K ohms across the source-drain of MNOS transistor $Q_4$. Under the conditions described the terminal 113 will be at a value of about 8.1 volts. As the current in MNOS device 17 begins to decrease under the influence of pulses applied to gate 51, the voltage at terminal 97 increases toward −25 and this voltage is transmitted over conductor 24 to the gate 125 of transistor $Q_4$. As the voltage on gate 125 increases toward −25, the threshold of MOS transistor $Q_4$ is passed and increasing current flows through the source-drain of this transistor, thereby decreasing the voltage across resistors 126 and 128. Increased current then flows through the parallel combination of transistor $Q_4$ and resistors 126, 128 and thus through the series combination with resistor 99 and resistor 56. By virtue of the IR drop cross resistor 56 the voltage at terminal 52A decreases and thus the magnitude of the pulses applied to the gate 51 of the MNOS device also decreases, the pulses being transmitted through the circuit described. As the MNOS device 17 continues to conduct less current under the influence of the applied pulses, the control voltage over conductor 24 increases toward −25 volts still further causing MOS transistor $Q_4$ to conduct more. The voltage at terminal 52A decreases proportionally with consequent decrease of the amplitude of the negative pulses applied to the gate 51 of the MNOS device 17.

When the current through MNOS device 17 has decreased to the point where the voltage at terminal 97 and thus the voltage at the gate of transistor $Q_4$ and ultimately the amplitude of pulses applied at gate 51 are such that no further decreases in current through MNOS device 17 can occur, the process comes to a halt. This may be visualized by referring to the graph 104 of FIG. 4. Thus initially the control voltage is at near 0 volts and full conduction through MNOS device 17 is taking place. This is represented by the portion 108 of the graph. As device 17 decreases conduction, the control voltage increases toward −25 as shown by the graph portion 129 and it increases rapidly at the vicinity of $T_2$ portion 108 of graph. In the area of $T_2$, the control voltage has increased toward −25 as close as it can. The MNOS device 17 is virtually non-conducting and, in effect, is turned completely off to where the resistance across its source-drain is extremely high. The time interval $T_2$ at the knee or bend of the curve 131 takes place fairly rapidly and over a relatively few pulses. The magnitude of the pulses on gate 51 has dropped to a low value and the threshold setting on the gate 51 is that value applied to it as a bias at terminal 73. The portion 132 of the graph is reached on each setting irrespective of the threshold value setting.

The feedback circuit thus, in effect, also determines the number of pulses which occur before discontinuing the application of pulses to gate 51.

The numerical values of resistance voltage, capacitance, etc. are by way of example for one particular case. It will be understood that other values may be used to suit other conditions.

Figure 5:
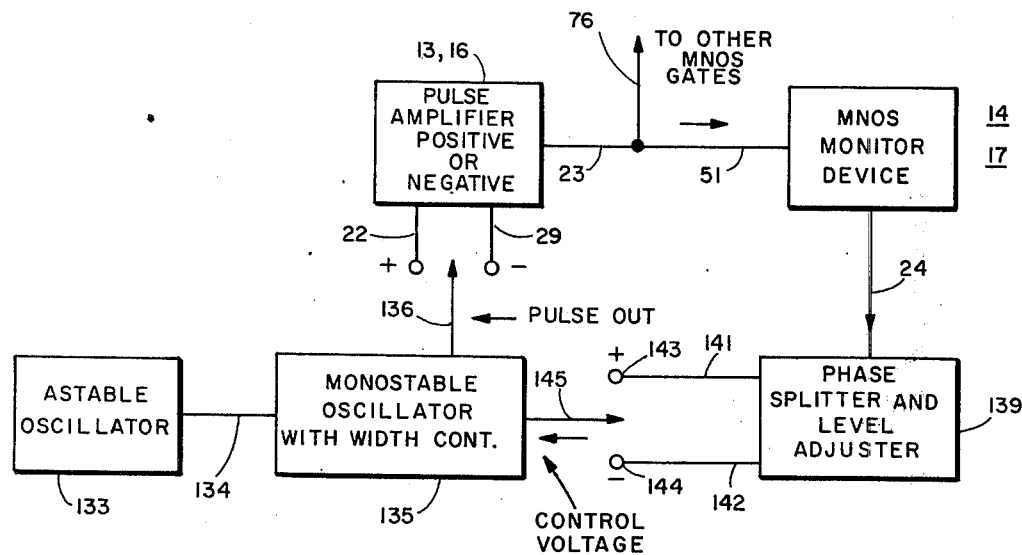
FIG. 5 is a block diagram of another form of the invention.

Referring to FIG. 5 there is shown a circuit arrangement in block form whereby the gate setting of an MNOS device may be achieved by varying the pulse width rather than varying the pulse amplitude. In FIG. 5 to the extent applicable the same reference characters are used as in the preceding figures.

Thus the pulse amplifier 13, 16 for positive or negative pulses supplies pulses over conductors 23 and 51 to the MNOS monitoring device 14 or 17 depending upon whether the MNOS device is to be turned off or turned on and the output or feedback signal from the monitor devices is fed over conductor 24 to the feedback portions of the circuit. In this form of the invention an astable oscillator 133 provides a pulse of the desired frequency which is fed over a conductor 134 to a monostable oscillator with width control 135. The output pulses of the oscillator 135 are supplied over the conductor 136 to the amplifier 13, 16 by way of conductors 137 and 138. The output signal, or control signal, from MNOS devices 14, 17 is transmitted over conductor 24 to a phase splitter and level adjuster 139 which provides a control voltage to control or adjust the width of the pulse. Depending upon whether the pulses are intended to be positive or negative, that is, for turning on or turning off the monitoring device, appropriate signals are developed by phase splitter and level adjuster 139 and transmitted over conductors 141, and 142 to terminals 143 and 144, respectively, for connection to a switch 145 and thus to the monostable oscillator 135. The control voltage coming over conductor 24 in FIG. 5 has magnitudes of the same value as are transmitted over conductor 24 in the operations described for FIG. 3. Thus the phase splitter and level adjuster receives a voltage whose magnitude is indicative of the conducting condition of the MNOS device. If the control voltage is negative and large in magnitude as represented by the portion 105 of the curve in FIG. 4 the control voltage developed in the phase splitter and level adjuster 139 will be large whereby the monostable oscillator 135 will develop a pulse having the maximum length. The maximum length pulse would be transmitted through the amplifier and through the circuit we described to the terminal 51 of the MNOS device to be set. Each pulse applied to terminal 51 will have the same maximum length until the MNOS device begins to conduct to reduce the magnitude of the control voltage. As the magnitude of the control voltage decreases the phase splitter and level adjuster 139 supplies signals to the monostable oscillator 135 whereby the pulse lengths coming out of the monostable oscillator are progressively decreased until the set point of the monitoring device is reached. At which point the feedback process stops and the MNOS device is set to the value desired.

For the turn on condition the control voltage must decrease the pulse width from say 50 microseconds maximum to 5 microseconds minimum. For the turn off condition the control voltage also must decrease the pulse from a maximum of 50 microseconds to a minimum of 5 microseconds. This requires a phase reversal of the signal from the MNOS monitor device making it necessary to use the phase splitter 139 in the control loop. The level of the control voltage into the monostable oscillator must correspond to the maximum width at the beginning of each setting operation.

The variation in pulse width can produce a variation in the effect on threshold for at least two reasons. The amount of charge moved by the pulse is a function of the time the pulse is applied, hence the pulse width controls the amount of shift. In addition, do to charging time of the gate capacity, the applied pulse may not reach full amplitude for several microseconds. For instance, if the input time constant is made 5 microseconds, the pulse amplitude would only reach 67 percent a full amplitude in the first 5 microseconds of the pulse. This effectively reduces the amplitude of narrow pulses so that the change in threshold may decrease rapidly as pulse width is reduced. It may be desirable to enhance the integration effect by adding shunt capacity or series resistance at the MNOS gate.

I claim:

1. An apparatus for setting the threshold conducting and nonconducting potential of a threshold memory device to a predetermined level, the memory device having a threshold conducting and nonconducting potential level, respectively, which tend to shift in the absence of controlling the conducting and nonconducting potential applied thereto, the memory device including a control electrode, comprising:

a first power supply conductor being adapted to receive a power supply voltage of a first polarity;

a second power supply conductor being adapted to receive a power supply voltage of a second polarity;

first resistive means having first and second terminals, said first terminal being coupled in series to said first power supply conductor;

means for biasing the control electrode of the memory device at predetermined first and second direct current potential levels, respectively, to provide initial conducting and nonconducting threshold levels for the memory device;

means for supplying a train of pulses to the control electrode of the memory device for causing the memory device to selectively switch from a conducting or nonconducting state and vice versa, said train of pulses being either positive or negative respectively;

feedback means operatively coupled between the output of the memory device and said means for supplying a train of pulses for sensing incremental changes of said output of the memory device for incrementally reducing the energy and number of pulses applied to the memory device by said means for supplying a train pulses so that no more than the necessary number of pulses are applied to the memory device to switch its state thereby preventing a shift in the conducting and nonconducting threshold potential level; and said means for supplying a train of pulses including:
a. capacitive means having first and second terminals respectively coupled between said second terminal of said first resistive means and said second power supply conductor for developing a voltage potential thereacross having a predetermined initial voltage amplitude;
b. first electron control means having first, second and control electrodes, said control electrode being adapted to receive a train of negative pulses, said pulses having relative voltage amplitudes which are less than said predetermined initial voltage amplitude developed across said capacitor means, said first electrode being connected to said second terminal of said first resistive means;
c. second electron control means having first, second, and control electrodes, said control electrode being adapted to receive a train of positive pulses, said pulses having relative voltage amplitudes which are less than said predetermined initial voltage amplitude developed across said capacitive means, said second electrode being coupled to said second terminal of said resistive means;
d. first switching means for coupling said second electrode of said first electron control means to the control electrode of the memory device when the memory device is to be switched to a conducting state and for coupling said second electrode of said second electron control means to the control electrode of the memory device when the memory device is to be switched to a nonconductive state; and
e. second switching means for coupling said second electrode of said first electron control means to said second power supply conductor when the memory device is to be switched to said conducting state and for connecting said first electrode of said second electron control means to said second power supply conductor when the memory device is to be switched to said nonconducting state.

2. The apparatus in accordance with claim 1 wherein:
said first electron control means comprises a bipolar transistor of the PNP conductivity type;
said second electron control means comprises a bipolar transistor of the NPN conductivity type; and
the memory device includes a source, and drain electrode, said drain electrode being coupled to an operating potential and being adapted to be the output of the memory device, said source electrode being connected to a reference ground terminal.

3. The apparatus in accordance with claim 2 wherein said feedback means includes:
a first field effect transistor of a first polarity type having a gate electrode, and first and second electrodes, said gate electrode being connected to the output of the memory device, said second electrode being connected to said second terminal of said capacitive means for supplying a train of pulses;
a second field effect transistor of a second polarity type having a gate electrode, and first and second electrodes, said gate electrode being connected to the output of the memory device, said first electrode being connected to said second terminal of said capacitive means of said means for supplying a train of pulses;
third switching means for coupling said first electrode of said first field effect transistor to said second terminal of said first resistive means when the memory device is to be switched to a conducting state and for coupling said second electrode of said second field effect transistor to said second terminal of said first resistive means when said memory device is to be switched to a nonconducting state;
second bias means connected between said first and second electrodes of said first field transistor for establishing a predetermined operating bias at said first electrode of said first field effect transistor when the memory device is to be switched to a conducting state; and
third bias means connected between said first and second electrodes of said second field effect transistor for establishing a predetermined operating bias at said second electrode of said second field effect transistor when the memory device is to be switched to a nonconducting state.

4. The apparatus in accordance with claim 3 wherein:
said first field effect transistor is rendered conductive in accordance to said incremental change in the output of the memory device whereby said predetermined initial voltage amplitude developed by said capacitive means of said means for supplying a train of pulses is incrementally reduced to limit the amplitude and the number of pulses applied to the memory device to maintain the conducting threshold potential thereof at the predetermined level; and
said second field effect transistor is rendered conductive in accordance to said incremental changes in the output of the memory device whereby said predetermined initial voltage amplitude developed by said capacitive means for said means for supplying a train of pulses is incrementally reduced to limit the amplitude and the number of pulses applied to the memory device to maintain the nonconducting threshold potential thereof at the predetermined level.

* * * * *